(12) United States Patent
Ukai et al.

(10) Patent No.: US 10,700,076 B2
(45) Date of Patent: Jun. 30, 2020

(54) NONVOLATILE SEMICONDUCTOR STORAGE DEVICE WITH CELL TRANSISTORS

(71) Applicant: ROHM Co., LTD., Kyoto (JP)

(72) Inventors: Kazuhisa Ukai, Kyoto (JP); Koji Nigoriike, Kyoto (JP)

(73) Assignee: ROHM CO., LTD., Tokyo (JP)

(*) Notice: Subject to any disclaimer, the term of this patent is extended or adjusted under 35 U.S.C. 154(b) by 0 days.

(21) Appl. No.: 16/177,635

(22) Filed: Nov. 1, 2018

(65) Prior Publication Data

US 2019/0131311 A1 May 2, 2019

(30) Foreign Application Priority Data

Nov. 1, 2017 (JP) .................. 2017-212061

(51) Int. Cl.
| | |
|---|---|
| *H01L 27/112* | (2006.01) |
| *G11C 7/06* | (2006.01) |
| *G11C 7/12* | (2006.01) |
| *G11C 8/08* | (2006.01) |
| *G11C 8/10* | (2006.01) |
| *G11C 8/14* | (2006.01) |
| *G11C 17/10* | (2006.01) |

(52) U.S. Cl.
CPC .......... *H01L 27/11266* (2013.01); *G11C 7/06* (2013.01); *G11C 7/12* (2013.01); *G11C 8/08* (2013.01); *G11C 8/10* (2013.01); *G11C 8/14* (2013.01); *G11C 17/10* (2013.01); *H01L 27/11226* (2013.01)

(58) Field of Classification Search
CPC .... G11C 7/06; G11C 7/12; G11C 8/08; G11C 8/10; G11C 16/04; G11C 16/0425; H01L 27/11266
See application file for complete search history.

(56) References Cited

U.S. PATENT DOCUMENTS

| | | | |
|---|---|---|---|
| 7,102,926 B2* | 9/2006 | Lee ................. | G11C 16/0425 365/185.11 |
| 7,218,544 B2* | 5/2007 | Yamauchi .......... | G11C 17/12 257/E27.102 |
| 7,379,332 B2* | 5/2008 | Lee ................. | G11C 16/0425 365/185.11 |

FOREIGN PATENT DOCUMENTS

JP      2004-303898 A     10/2004

* cited by examiner

*Primary Examiner* — Gene N Auduong
(74) *Attorney, Agent, or Firm* — Chip Law Group

(57) ABSTRACT

A nonvolatile semiconductor storage device includes a plurality of cell transistor pairs including a pair of cell transistors sharing a first node connected to a bit line or a source line, and a dummy gate line laid in parallel with gate lines of the cell transistors, the dummy gate line applying an off voltage to a dummy transistor between the cell transistor pairs. The gate lines and the dummy gate line may be laid at equal intervals. A plurality of impurity diffusion layers corresponding to the first node and second nodes of the cell transistors may be formed at equal intervals in a continuous active region.

17 Claims, 11 Drawing Sheets

NONVOLATILE SEMICONDUCTOR STORAGE DEVICE WITH CELL TRANSISTORS

CROSS REFERENCE TO RELATED APPLICATIONS

This US. Application claims priority benefit of Japanese Patent Application No. 2017-212061 filed in the Japan Patent Office on Nov. 1, 2017. Each of the above-referenced applications is hereby incorporated herein by reference in its entirety.

BACKGROUND

The technology disclosed in the present specification relates to a nonvolatile semiconductor storage device.

In the past, a read-only nonvolatile semiconductor storage device (so-called masked read only memory (ROM)) in which desired data or a desired program is written in a manufacturing process thereof has been used in various applications. Incidentally, Japanese Patent Laid-Open No. 2004-303898 can be cited as an example of a related art related to the above.

SUMMARY

However, there is room for further improvement with regard to variations in the characteristics of cell transistors in the existing nonvolatile semiconductor storage device.

In view of the above-described problem discovered by the inventors of the present application, according the technology disclosed in the present specification, it is desirable to provide a nonvolatile semiconductor storage device in which cell transistors have small characteristic variations.

A nonvolatile semiconductor storage device disclosed in the present specification has a configuration (first configuration) including a plurality of cell transistor pairs including a pair of cell transistors sharing a first node connected to a bit line or a source line, and a dummy gate line laid in parallel with gate lines of the cell transistors, the dummy gate line applying an off voltage to a dummy transistor between the cell transistor pairs.

Incidentally, the nonvolatile semiconductor storage device constituted of the foregoing first configuration preferably has a configuration (second configuration) in which the gate lines and the dummy gate line are laid at equal intervals.

In addition, the nonvolatile semiconductor storage device constituted of the foregoing first or second configuration preferably has a configuration (third configuration) in which a plurality of impurity diffusion layers corresponding to the first node and second nodes of the cell transistors are formed at equal intervals in a continuous active region.

In addition, the nonvolatile semiconductor storage device constituted of the foregoing third configuration preferably has a configuration (fourth configuration) in which a plurality of cell transistors connected to the common bit line are formed in one linear active region without a break.

In addition, the nonvolatile semiconductor storage device constituted of one of the foregoing first to fourth configurations preferably has a configuration (fifth configuration) in which data is written to the cell transistors by a contact type of mask programming.

In addition, the nonvolatile semiconductor storage device constituted of the foregoing fifth configuration preferably has a configuration (sixth configuration) in which presence or absence of connection of second nodes of the cell transistors to the source line or the bit line is set according to the data.

In addition, the nonvolatile semiconductor storage device constituted of the foregoing sixth configuration preferably has a configuration (seventh configuration) in which the presence or absence of connection of the second nodes of the cell transistors to the source line or the bit line is set by presence or absence of a contact, presence or absence of a via or a through hole, or presence or absence of a metal according to the data.

In addition, the nonvolatile semiconductor storage device constituted of one of the foregoing first to seventh configurations preferably has a configuration (eighth configuration) in which the cell transistors are a negative-channel (N-channel) metal oxide semiconductor (MOS) field-effect transistor.

In addition, the nonvolatile semiconductor storage device constituted of one of the foregoing first to eighth configurations preferably has a configuration (ninth configuration) further including an X-decoder configured to drive the gate lines, a Y-decoder configured to drive the bit line, a sense amplifier configured to read data via the bit line, and a controller configured to control each part of the device.

In addition, an electronic apparatus disclosed in the present specification has a configuration (tenth configuration) including the nonvolatile semiconductor storage device constituted of one of the foregoing first to ninth configurations.

According to the technology disclosed in the present specification, it is possible to provide a nonvolatile semiconductor storage device in which cell transistors have small characteristic variations.

DETAILED DESCRIPTION OF THE PREFERRED EMBODIMENTS

<Nonvolatile Semiconductor Storage Device>

Figure 1:
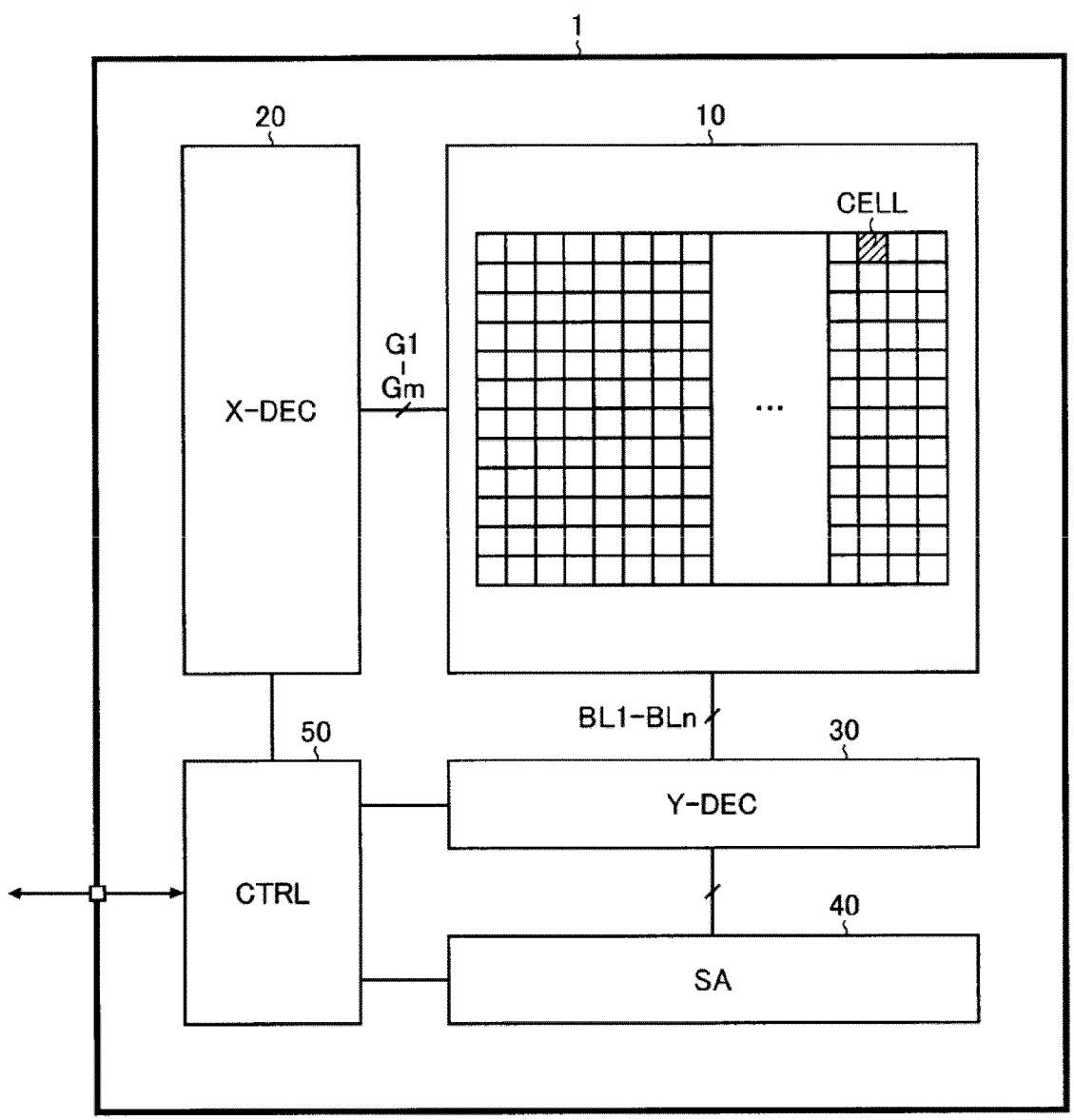
FIG. 1 is a block diagram depicting a general configuration of a nonvolatile semiconductor storage device.

FIG. 1 is a block diagram depicting a general configuration of a nonvolatile semiconductor storage device. The nonvolatile semiconductor storage device in the present configuration example includes a memory array 10, an X-decoder 20, a Y-decoder 30, a sense amplifier 40, and a controller 50.

The memory array 10 includes: m gate lines G1 to Gm (=word lines) laid in an X-axis direction; n bit lines BL1 to BLn laid in a Y-axis direction; and a plurality (=m×n) of memory cells CELL arranged in the form of a matrix along the gate lines G1 to Gm and the bit lines BL1 to BLn. The configuration and operation of the memory array 10 will be described later in detail.

The X-decoder (row decoder) 20 drives the gate lines G1 to Gm according to an instruction from the controller 50.

The Y-decoder (column decoder) 30 drives the bit lines BL1 to BLn according to an instruction from the controller 50.

The sense amplifier 40 reads data stored in the memory array 10 via the bit lines BL1 to BLn, and outputs the data to the controller 50.

The controller 50 outputs the requested data to the outside of the device by controlling parts (the X-decoder 20, the Y-decoder 30, and the sense amplifier 40, or the like) of the device according to a read command input from the outside of the device.

Memory Array (Comparative Example)

Figure 2:
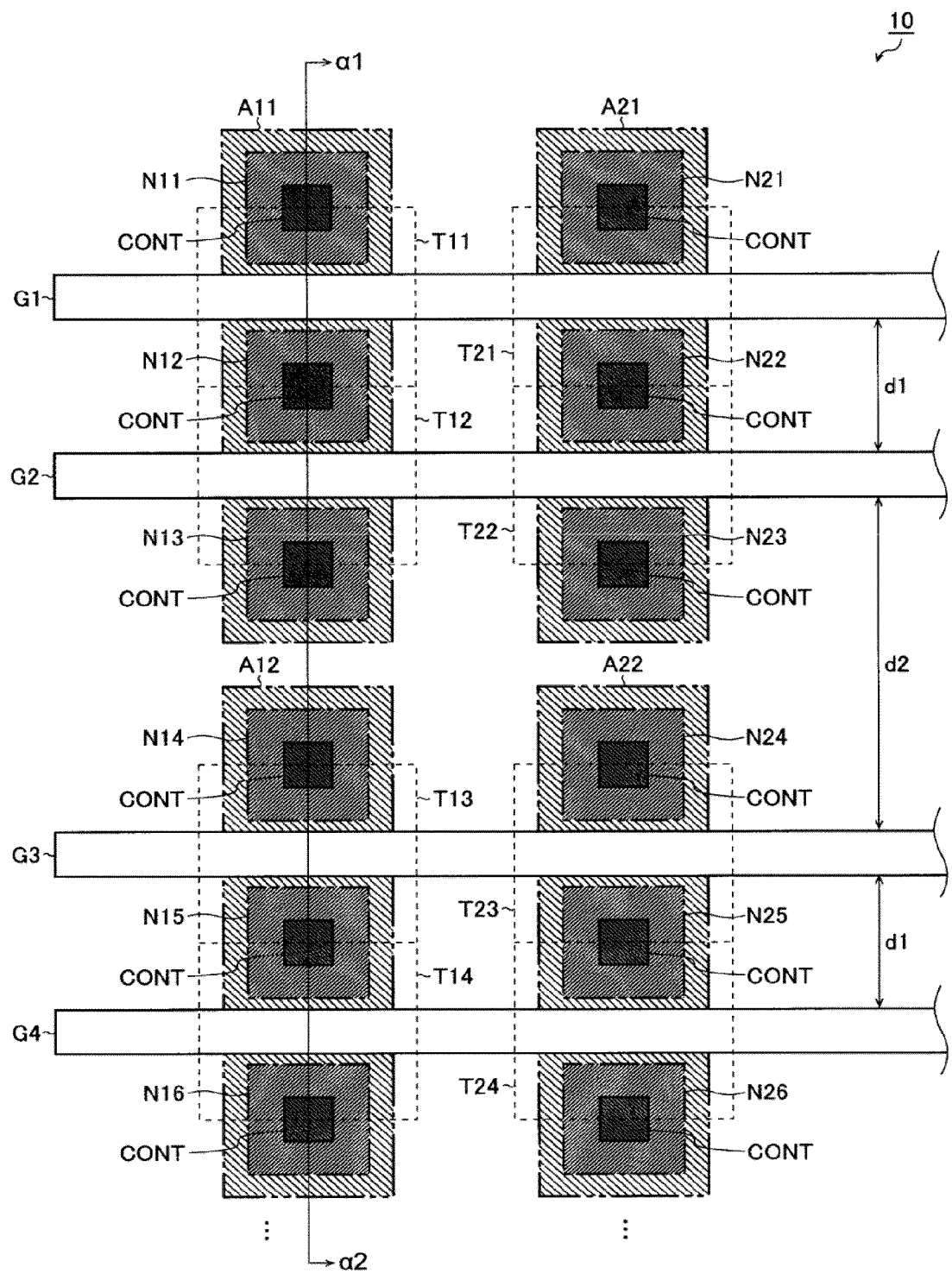
FIG. 2 is a plan view depicting a comparative example of a memory array.
Figure 3:
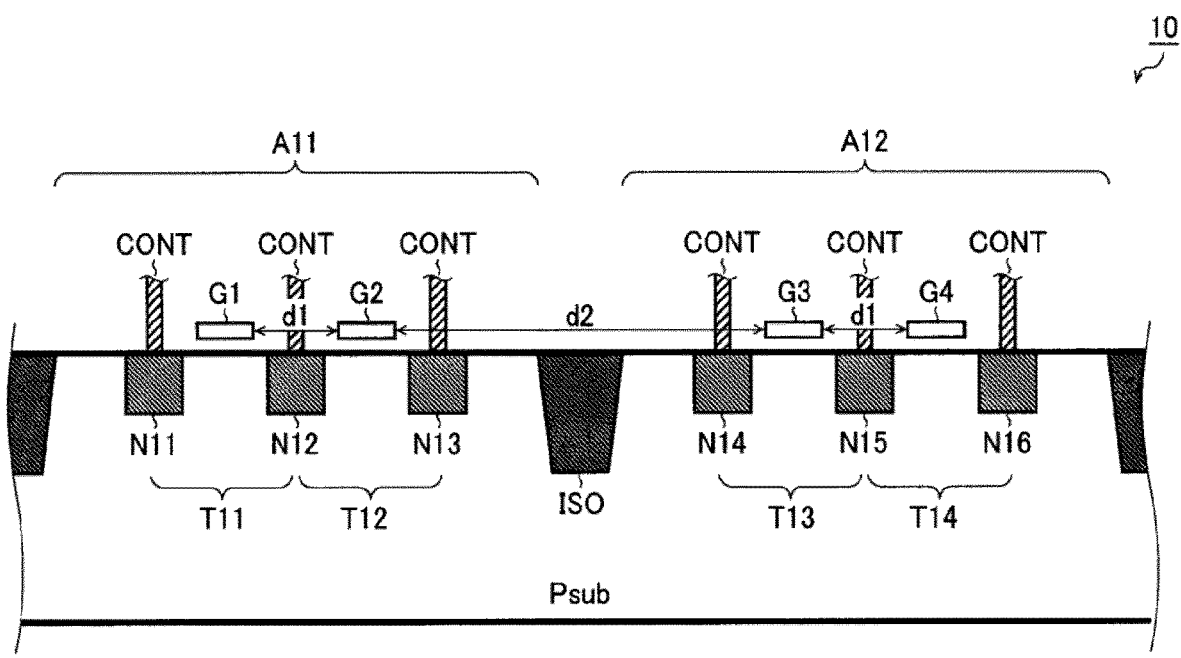
FIG. 3 is a vertical sectional view depicting the comparative example of the memory array.
Figure 4:
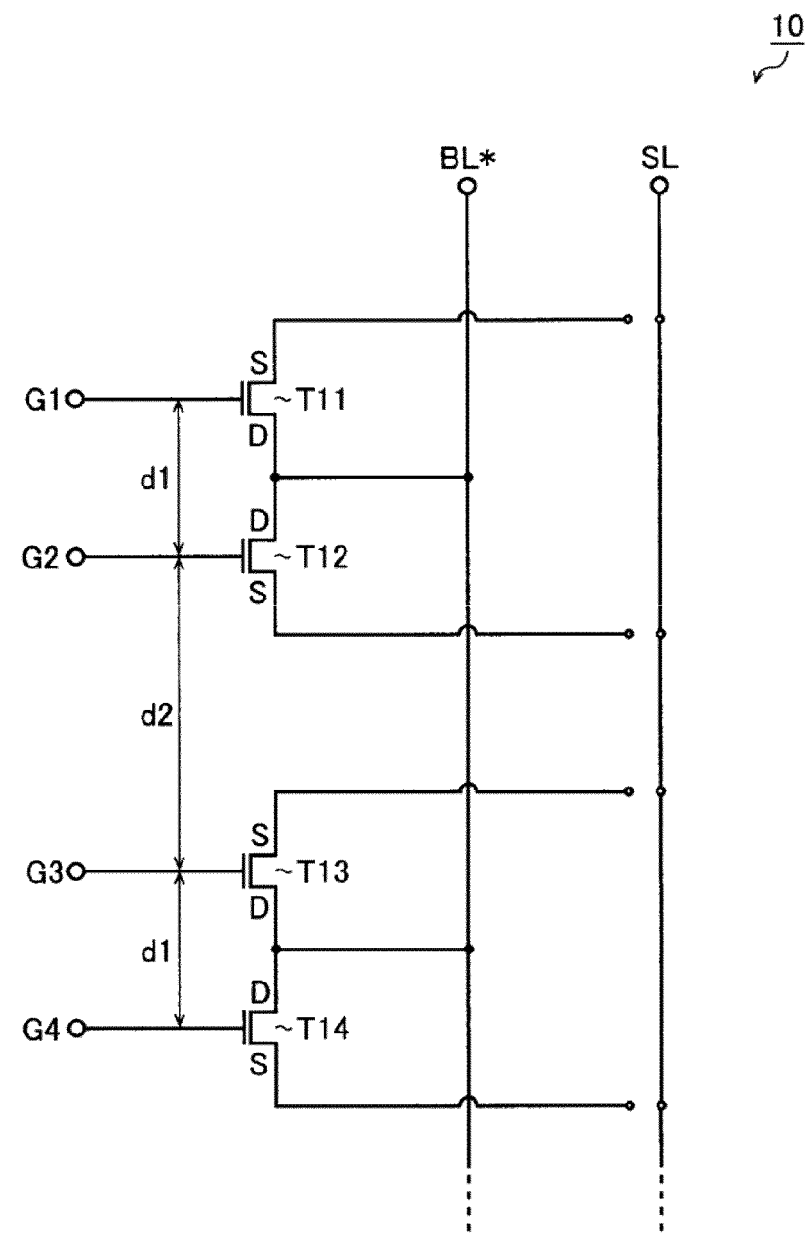
FIG. 4 is an equivalent circuit diagram depicting the comparative example of the memory array.

In the following, prior to description of an embodiment of the memory array 10, brief description will be made of a comparative example for comparison with the embodiment. FIGS. 2 to 4 are respectively a plan view, a vertical sectional view (=sectional view taken along a line α1-α2 in FIG. 2), and an equivalent circuit diagram depicting the comparative example of a memory array 10.

The memory array 10 according to the comparative example is a NOR type masked ROM in which m cell transistors T*1 to T*m (FIGS. 2 to 4 depict only cell transistors T11 to T14 or cell transistors T21 to T24) are connected in parallel with each other for each of n bit lines BL* (where *=1, 2, . . . , n). Incidentally, the cell transistors T11 to T14 and the cell transistors T21 to T24 are each an N-channel MOS field-effect transistor, and each correspond to a memory cell CELL in FIG. 1.

Connection relation between the cell transistors T11 to T14 will be described with reference to FIG. 4. Respective gates of the cell transistors T11 to T14 are connected to gate lines G1 to G4. In addition, respective drains D (corresponding to a first node) of the cell transistors T11 to T14 are each connected to a bit line BL*. On the other hand, the presence or absence of connection of the sources S (corresponding to a second node) of the respective cell transistors T11 to T14 to a source line SL (=GND line) is set by a contact type of mask programming according to data to be written to the respective cell transistors T11 to T14.

Figure 5:
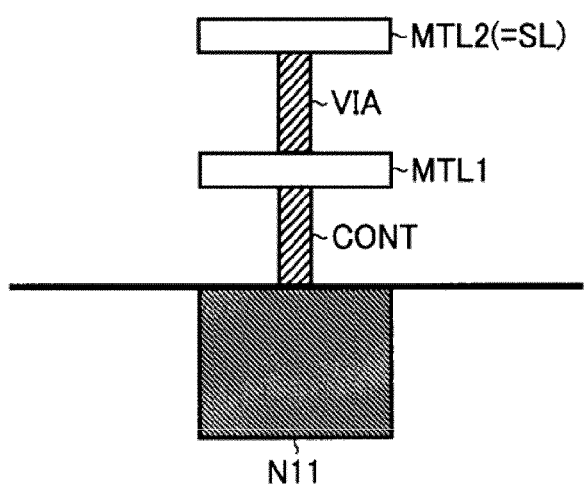
FIG. 5 is a vertical sectional view of assistance in explaining a contact type of mask programming.

FIG. 5 is a vertical sectional view of assistance in explaining the contact type of mask programming. When data "0" is to be written to the cell transistor T11, for example, it suffices to effect conduction between an impurity diffusion region N11 corresponding to the source S of the cell transistor T11 and a metal MTL2 corresponding to the source line SL by a contact CONT, a via VIA (or a through hole), and a metal MTL1.

Conversely, when data "1" is to be written to the cell transistor T11, it suffices to effect isolation between the source S of the cell transistor T11 and the source line SL by not forming at least one of the contact CONT, the via VIA (or a through hole), and the metal MTL1 or MTL2 described above.

Incidentally, in the present figure, an example is cited in which the metal MTL2 in a second layer from the bottom is the source line SL. However, the number of metal layers is arbitrary, and use of a metal in other than the second layer (a first layer, a third layer, a fourth layer, . . . from the bottom) as the source line SL is also arbitrary. Irrespective of which layer is used as the source line SL, different data "0"/"1" can be generated according to whether the impurity diffusion layer N11 is connected to the source line SL.

In addition, when the data is to be read from the cell transistor T11, it suffices to precharge the bit line BL*, then set the gate line G1 to a high level, and read the signal level (for example a voltage level) of the bit line BL* by the sense amplifier 40.

When there is conduction between the source S of the cell transistor T11 and the source line SL, for example, turning on the cell transistor T11 causes a charge to pass from the bit line BL* to the source line SL. As a result, the voltage level of the bit line BL* becomes lower than a threshold value, and thus an output signal of the sense amplifier 40 is at a low level (corresponding to data "0").

When there is isolation between the source S of the cell transistor T11 and the source line SL, on the other hand, the charge does not pass from the bit line BL* to the source line SL even when the cell transistor T11 is turned on. As a result, the voltage level of the bit line BL* becomes higher than the threshold value, and thus the output signal of the sense amplifier 40 is at a high level (corresponding to data "1").

The nonvolatile semiconductor storage device 1 thus adopts the contact type of mask programming (system of setting the presence or absence of connection between the source S of the cell transistor and the source line SL by the presence or absence of the contact CONT, the presence or absence of the via VIA (or a through hole), or the presence or absence of the metal MTL according to data) as a method of writing data to the cell transistor.

The memory array 10 according to the comparative example has a structure where the gate lines G1 to G4 are not laid at equal intervals. The memory array 10 according to the comparative example therefore has a problem in that the characteristics of the cell transistors T11 to T14 (or the cell transistors T21 to T24) tend to vary. This will be described in the following.

As depicted in FIG. 2 and FIG. 3, active regions A11 and A12 (or active regions A21 and A22) separated from each other by an element isolation layer ISO (for example shallow trench isolation (STI) or local oxidation of silicon (LOCOS)) are formed in a P-type semiconductor substrate Psub so as to be arranged in one row.

N-type impurity diffusion layers N11 to N13 and N14 to N16 are formed at equal intervals in the active regions A11 and A12, respectively. In addition, N-type impurity diffusion layers N21 to N23 and N24 to N26 are formed at equal intervals in the active regions A21 and A22, respectively.

The gate line G1 is linearly laid between the impurity diffusion layers N11 and N12 and between the impurity diffusion layers N21 and N22 so as to intersect each of the active regions A11 and A21. Similarly, the gate line G2 is linearly laid between the impurity diffusion layers N12 and N13 and between the impurity diffusion layers N22 and N23 so as to intersect each of the active regions A11 and A21.

In addition, the gate line G3 is linearly laid between the impurity diffusion layers N14 and N15 and between the impurity diffusion layers N24 and N25 so as to intersect each of the active regions A12 and A22. Similarly, the gate line G4 is linearly laid between the impurity diffusion layers N15 and N16 and between the impurity diffusion layers N25 and N26 so as to intersect each of the active regions A12 and A22.

Incidentally, in the memory array 10 having the above-described structure, the impurity diffusion layer N11 corresponds to the source S of the cell transistor T11, and the impurity diffusion layer N13 corresponds to the source S of the cell transistor N12. In addition, the impurity diffusion layer N12 corresponds to the drain D of both of the cell transistors T11 and T12. That is, a cell transistor pair including a pair of the cell transistors T11 and T12 sharing the drain D with each other is formed in the active region A11.

Similarly, the impurity diffusion layer N14 corresponds to the source S of the cell transistor T13, and the impurity diffusion layer N16 corresponds to the source S of the cell transistor T14. In addition, the impurity diffusion layer N15 corresponds to the drain D of both of the cell transistors T13 and T14. That is, a cell transistor pair including a pair of the cell transistors T13 and T14 sharing the drain D with each other is formed in the active region A12.

The above is also true for the active regions A21 and A22. Cell transistor pairs (the cell transistors T21 and T22 and the cell transistors T23 and T24) are formed in the active regions A21 and A22, respectively.

Here, as also described earlier, the active region A11 and the active region A12 (and the active region A21 and the active region A22) are separated from each other by the element isolation layer ISO. Therefore, a gate interval d1 between the gate lines G1 and G2 (or the gate lines G3 and G4) between which the element isolation layer ISO is not interposed and a gate interval d2 between the gate lines G2 and G3 between which the element isolation layer ISO is interposed do not necessarily coincide with each other.

In the memory array 10 according to the comparative example in which the gate lines G1 to G4 are thus not laid at equal intervals, the characteristics of the cell transistors T11 to T14 (or the cell transistors T21 to T24) tend to vary. In the following, detailed description will be made of a novel structure that can solve this problem.

Memory Array (Embodiment)

Figure 6:
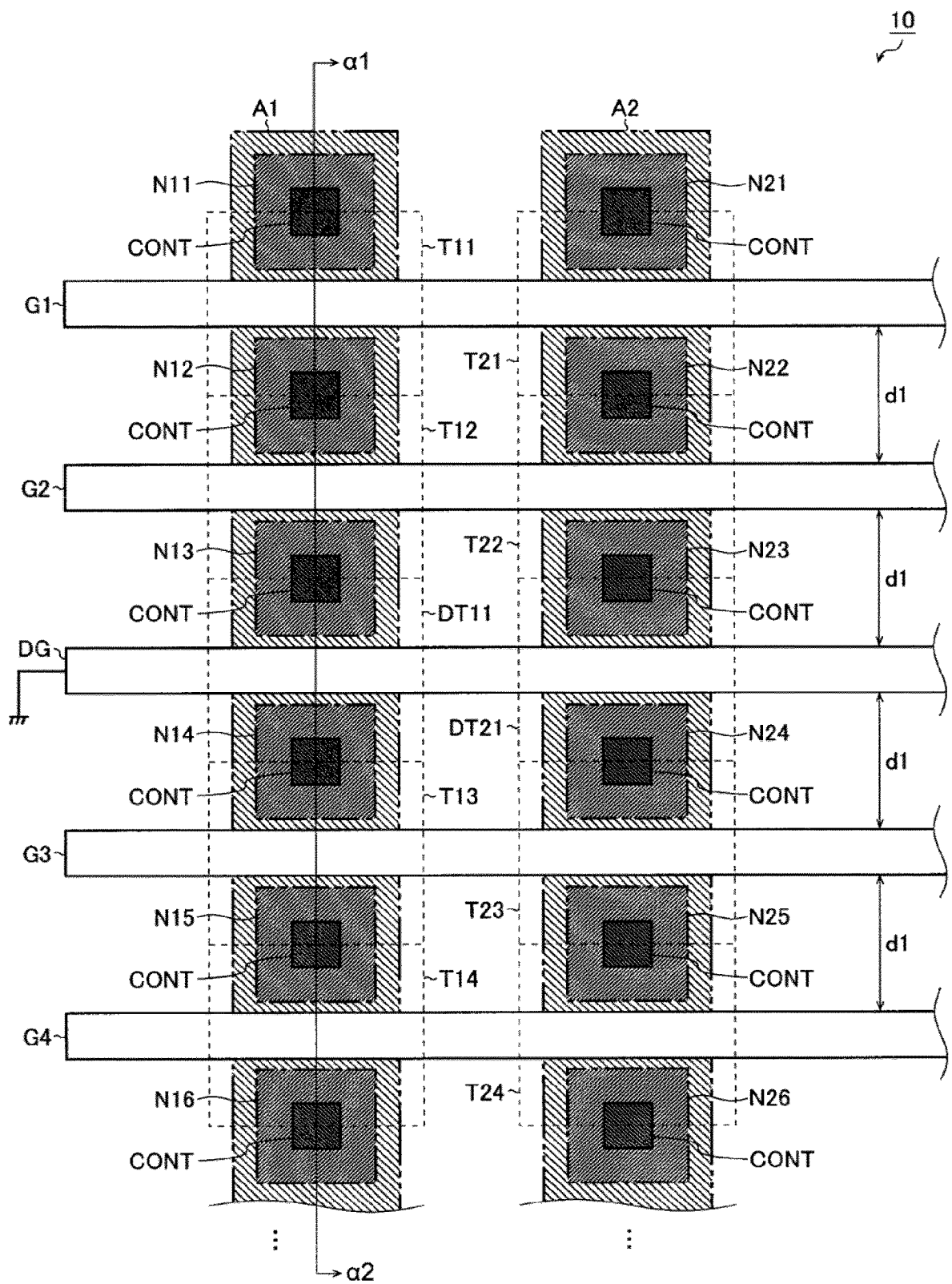
FIG. 6 is a plan view depicting an embodiment of a memory array.
Figure 7:
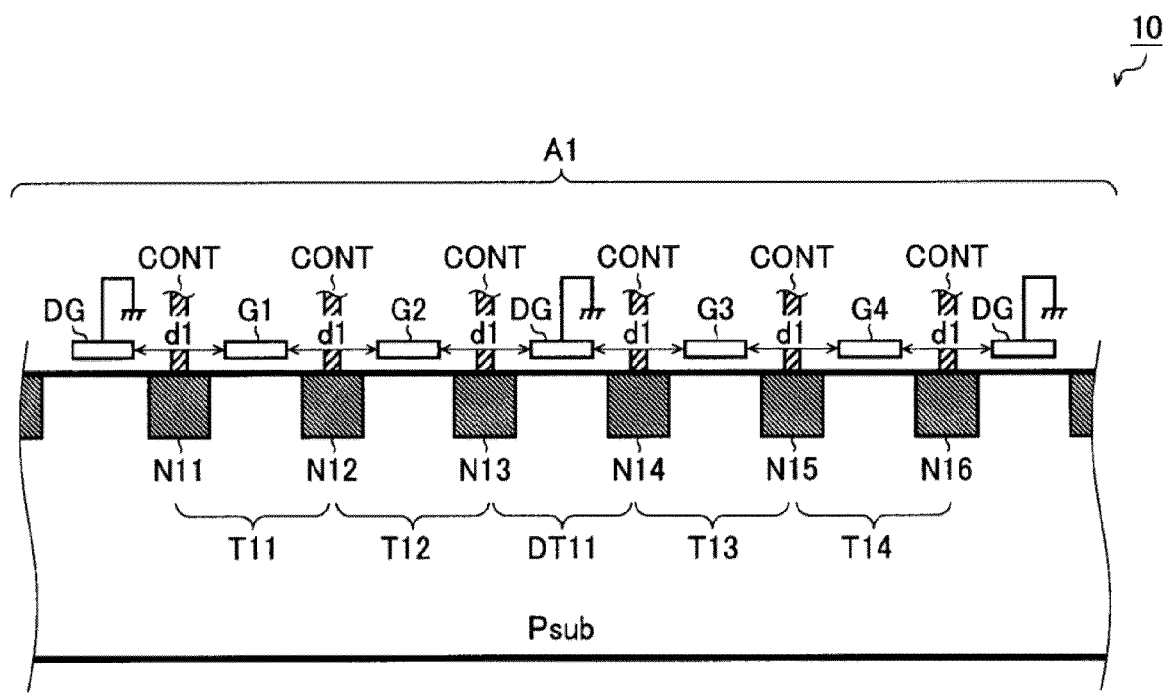
FIG. 7 is a vertical sectional view depicting the embodiment of the memory array.
Figure 8:
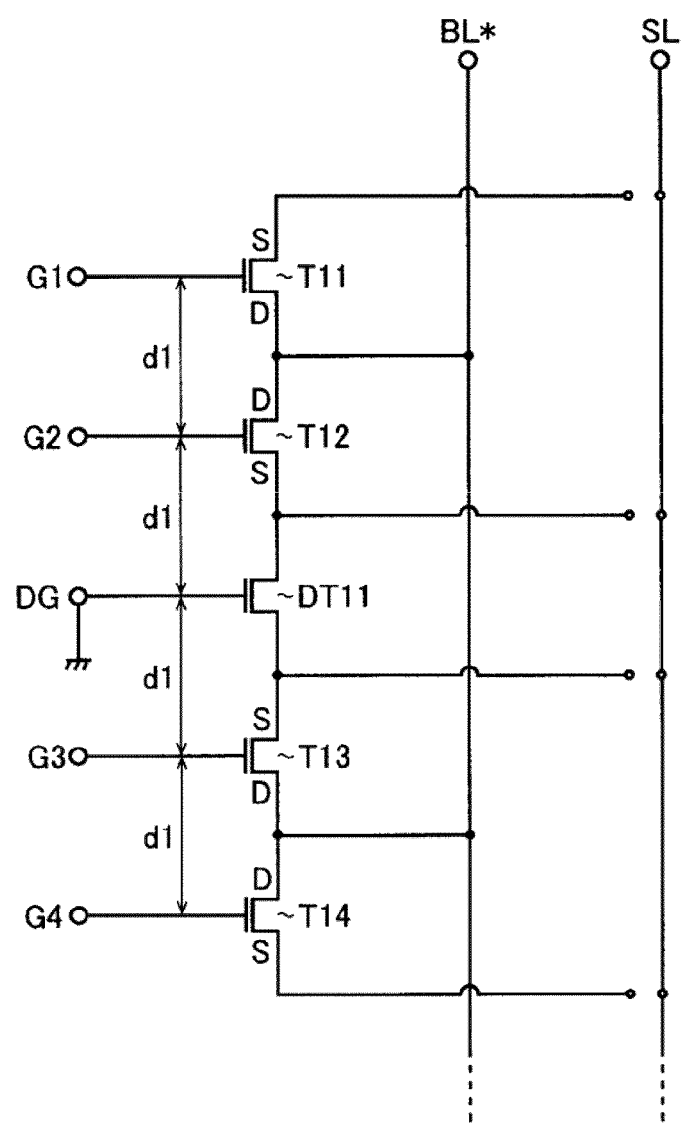
FIG. 8 is an equivalent circuit diagram depicting the embodiment of the memory array.

Detailed description will next be made of an embodiment of a memory array 10 that can solve the above-described problem. FIGS. 6 to 8 are respectively a plan view, a vertical sectional view (=sectional view taken along a line α1-α2 in FIG. 6), and an equivalent circuit diagram depicting an embodiment of a memory array 10. Incidentally, the memory array 10 according to the present embodiment is characterized in that element isolation for cell transistors is performed by using a dummy gate DG without using the element isolation layer ISO while the memory array 10 according to the present embodiment is based on the aforementioned comparative example (FIGS. 2 to 4). Accordingly, constituent elements similar to those of the comparative example are identified by the same reference symbols as in FIGS. 2 to 4, and thereby repeated description thereof will be omitted. In the following, description will be focused on characteristic parts of the present embodiment.

As a first change, the impurity diffusion layers N11 to N16 corresponding to the sources S or the drains D of the respective cell transistors T11 to T14 are formed at equal intervals in one continuous active region A1 without being separated by the element isolation layer ISO. In other words, the cell transistors T11 to T14 are formed in one linear active region A1 without a break.

Similarly, the impurity diffusion layers N21 to N26 corresponding to the sources S or the drains D of the respective cell transistors T21 to T24 are formed at equal intervals in one continuous active region A2 without being separated by the element isolation layer ISO. That is, the cell transistors T21 to T24 can be said to be formed in one linear active region A2 without a break.

In addition, as a second change, instead of providing the element isolation layer ISO, a dummy gate line DG is laid between the gate line G2 and the gate line G3. Specifically, the dummy gate line DG is laid between the impurity diffusion layers N13 and N14 and between the impurity diffusion layers N23 and N24 and in parallel with the gate lines G1 to G4 so as to intersect each of the active regions A1 and A2.

Incidentally, as also described earlier, the impurity diffusion layers N11 to N16 and N21 to N26 are formed at equal intervals in the continuous active regions A1 and A2, respectively. Hence, the gate lines G1 to G4 and the dummy gate line DG laid between those impurity diffusion layers are also at equal intervals. More specifically, respective gate intervals between G1 and G2, between G2 and DG, between DG and G3, and between G3 and G4 can each be designed to be "d1."

However, because the above-described dummy gate DG is laid, dummy transistors DT11 and DT21 are respectively formed between the impurity diffusion layers N13 and N14 and between the impurity diffusion layers N23 and N24, the dummy transistors DT11 and DT21 having one impurity diffusion layer as a source S, and having the other impurity diffusion layer as a drain D.

That is, the dummy transistor DT11 is formed between the transistor pair T11 and T12 and the transistor pair T13 and T14. In addition, the dummy transistor DT21 is formed between the transistor pair T21 and T22 and the transistor pair T23 and T24.

When these dummy transistors DT11 and DT21 are erroneously turned on, the cell transistors T12 and T13 and the cell transistors T22 and T23 are short-circuited, so that the memory array 10 does not operate properly.

Accordingly, it suffices to apply an off voltage (=ground voltage GND) for holding the dummy transistors DT11 and DT21 in an off state at all times to the dummy gate line DG.

The structure in which element isolation for the cell transistors is performed by thus using the dummy gate DG without using the element isolation layer ISO facilitates manufacturing the memory array 10, and is able to suppress variations in the characteristics of the cell transistors with the gate intervals set uniform.

Figure 9:
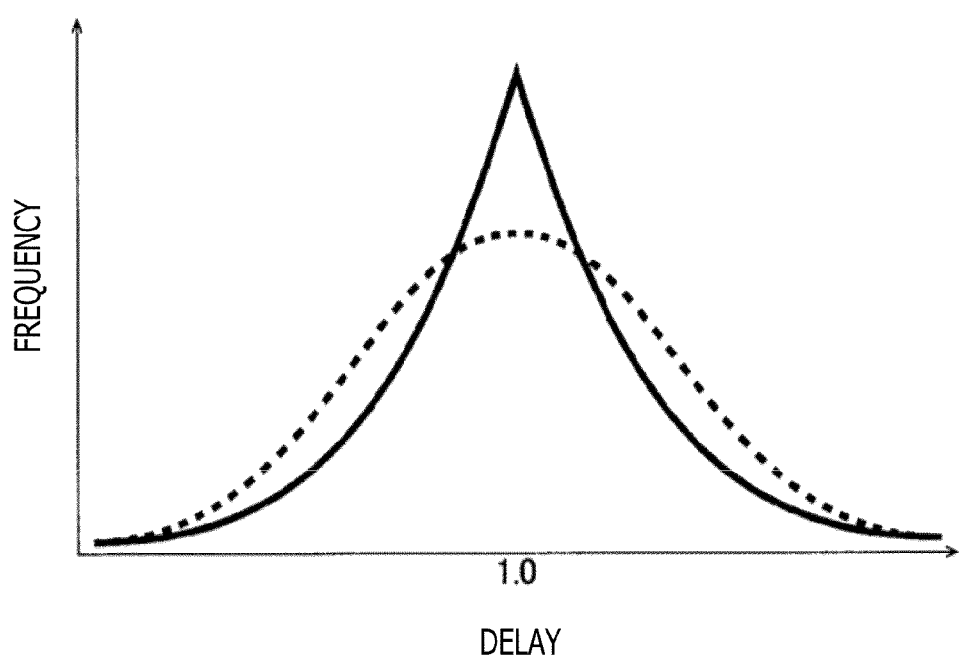
FIG. 9 is a diagram of characteristic comparison between the comparative example and the embodiment.

FIG. 9 is a diagram of characteristic comparison between the aforementioned comparative example (FIGS. 2 to 4: a broken line) and the embodiment (FIGS. 6 to 8: a solid line). Incidentally, an axis of abscissas in the present diagram indicates a normalized amount of delay of cell transistors (an example of a characteristic value as an index of characteristic variations). In addition, an axis of ordinates in the present diagram indicates frequency (number of cell transistors) with respect to the amount of delay.

As depicted in the diagram, the aforementioned embodiment (solid line) having uniform gate intervals can suppress variations in the amount of delay of the cell transistors as compared with the aforementioned comparative example (broken line) in which the gate intervals are not uniform. It is consequently possible to improve the yield and data reading characteristic of the nonvolatile semiconductor storage device 1.

<Modification>

In the comparative example and the embodiment described above, a pair of cell transistors forming a transistor pair shares a drain D, and the presence or absence of connection of the sources S of the cell transistors to the source line SL is set according to data to be written to the respective cell transistors. However, the relation between the drain D and the sources S can be mutually interchanged.

Figure 10:
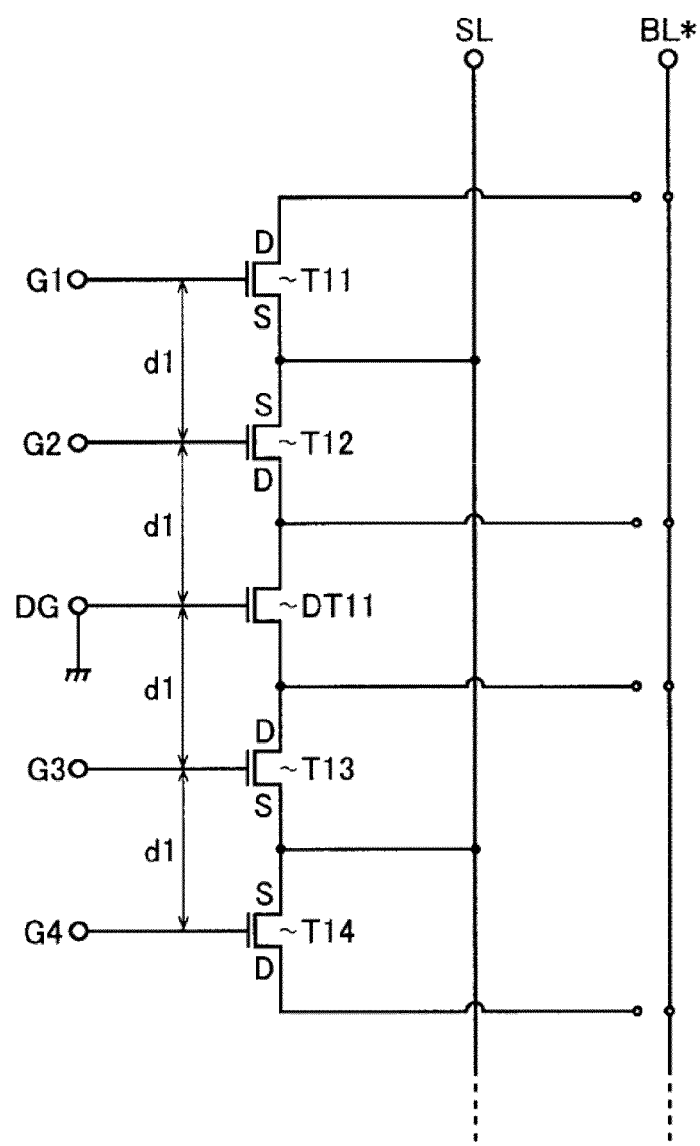
FIG. 10 is an equivalent circuit diagram depicting a modification of the memory array.

FIG. 10 is an equivalent circuit diagram depicting a modification of the memory array 10 (example in which the relation between the drains D and the sources S in the aforementioned FIG. 8 is interchanged). In the present modification, the sources S (corresponding to a first node) of the respective cell transistors T11 to T14 are each connected to the source line SL. On the other hand, the presence or absence of connection of the drains D (corresponding to a second node) of the respective cell transistors T11 to T14 to the bit line BL* is set according to data to be written to the respective cell transistors.

Also in such a memory array 10, as described earlier, the structure in which element isolation for the cell transistors is performed by using the dummy gate DG without using the element isolation layer ISO facilitates manufacturing the memory array 10, and is able to suppress variations in the characteristics of the cell transistors with gate intervals set uniform.

<Electronic Apparatus>

Figure 11:
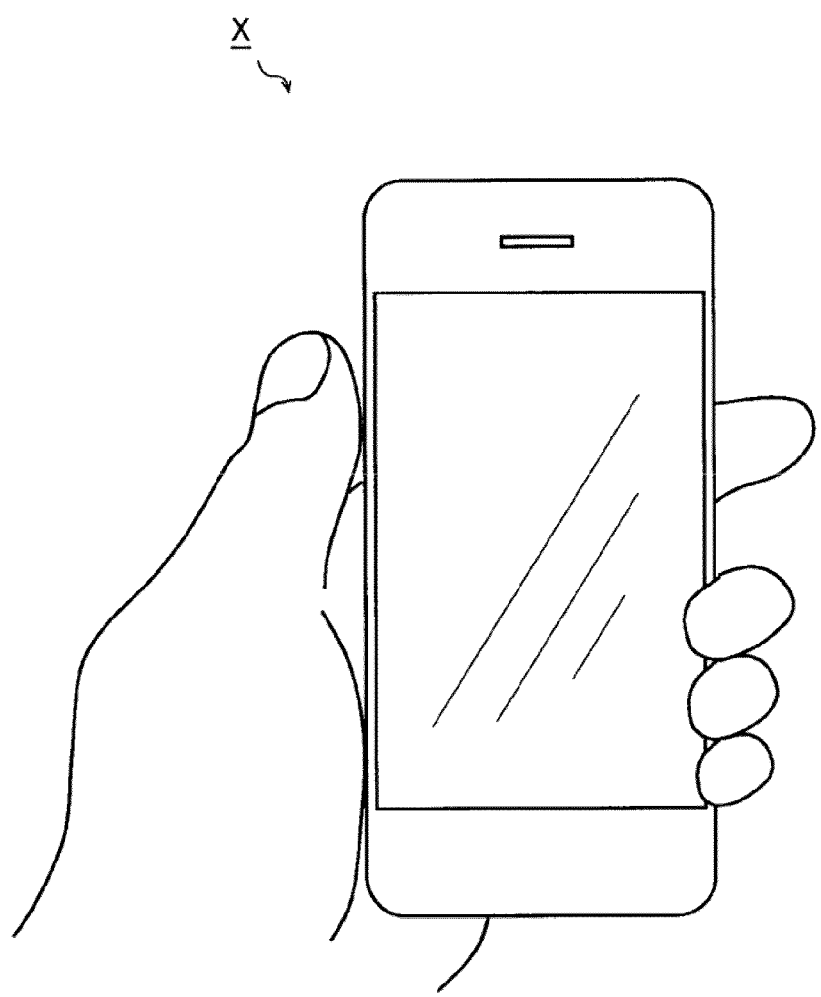
FIG. 11 is an external view of a smart phone.

FIG. 11 is an external view of a smart phone. A smart phone X is an example of an electronic apparatus including the nonvolatile semiconductor storage device 1 described thus far as means for storing system firmware of the smart phone X or the like in a nonvolatile manner.

However, objects in which to include the nonvolatile semiconductor storage device 1 are not at all limited to this, but the nonvolatile semiconductor storage device 1 can be suitably included also in other electronic apparatuses.

<Other Modifications>

It is to be noted that in addition to the foregoing embodiments, various technical features disclosed in the present specification can be modified in various manners without departing from the spirit of the technological creation thereof. In other words, it is to be considered that the foregoing embodiments are illustrative in all respects, and not restrictive. It is to be understood that the technical scope of the present technology is not limited to the foregoing embodiments, but includes meanings equivalent to claims and all modifications as fall within the scope.

The technology disclosed in the present specification can for example be suitably used as a technology for suppressing manufacturing variations (variations in the characteristics of cell transistors) in masked ROMs to be included in various electronic apparatuses.

The present disclosure contains subject matter related to that disclosed in Japanese Priority Patent Application JP 2017-212061 filed in the Japan Patent Office on Nov. 1, 2017, the entire content of which is hereby incorporated by reference.

It should be understood by those skilled in the art that various modifications, combinations, sub-combinations and alterations may occur depending on design requirements and other factors insofar as they are within the scope of the appended claims or the equivalent thereof.

What is claimed is:

1. A nonvolatile semiconductor storage device comprising:
   a first pair of cell transistors sharing a first node connected to one of a bit line and a source line, wherein the first pair of cell transistors forms a first pair of mask read only memory cells;
   a second pair of cell transistors sharing a second node connected to the one of the bit line and the source line, wherein the second pair of cell transistors forms a second pair of mask read only memory cells;
   transistor gate lines connected to the first pair of cell transistors and the second pair of cell transistors, respectively;
   a dummy transistor arranged between the first pair of cell transistors and the second pair of cell transistors; and
   a dummy gate line laid in parallel with the transistor gate lines, wherein
      the dummy gate line is connected to the dummy transistor, and
      the dummy gate line applies an off voltage to the dummy transistor.

2. The nonvolatile semiconductor storage device according to claim 1, wherein
   an interval between the transistor gate lines connected to the first pair of cell transistors is equal to an interval between the dummy gate line and one of the transistor gate lines neighboring the dummy gate line.

3. The nonvolatile semiconductor storage device according to claim 1, wherein
   a plurality of impurity diffusion layers corresponding to the first node and second nodes of the first pair of cell transistors are formed at equal intervals in a continuous active region.

4. The nonvolatile semiconductor storage device according to claim 3, wherein
   the dummy transistor includes one linear active region ranging on both sides of the dummy gate line without a break.

5. The nonvolatile semiconductor storage device according to claim 1, wherein
   data is written to each of the first pair of cell transistors and the second pair of cell transistors by a contact type of mask programming.

6. The nonvolatile semiconductor storage device according to claim 5, wherein
   presence or absence of connection of second nodes of the first pair of cell transistors and the second pair of cell transistors to other of the bit line and the source line is set according to the data, respectively.

7. The nonvolatile semiconductor storage device according to claim 6, wherein
   the presence or absence of connection of the second nodes of the first pair of cell transistors and the second pair of cell transistors to the other of the bit line and the source line is set by one of presence or absence of a contact, presence or absence of a via or a through hole, or presence or absence of a metal according to the data.

8. The nonvolatile semiconductor storage device according to claim 1, wherein
   each of the first pair of cell transistors and the second pair of cell transistors is a negative-channel metal oxide semiconductor field-effect transistor.

9. The nonvolatile semiconductor storage device according to claim 1, further comprising:
   an X-decoder configured to drive the transistor gate lines;
   a Y-decoder configured to drive the bit line;
   a sense amplifier configured to read data via the bit line; and
   a controller configured to control each part of the nonvolatile semiconductor storage device.

10. An electronic apparatus comprising the nonvolatile semiconductor storage device according to claim 1.

11. The nonvolatile semiconductor storage device according to claim 2, wherein one of the first pair of cell transistors neighboring the dummy transistor includes an impurity diffusion layer, and the dummy transistor includes an impurity diffusion layer continuously formed with the impurity diffusion layer of the one of the first pair of cell transistors neighboring the dummy transistor.

12. A nonvolatile semiconductor storage device comprising:
   a first pair of cell transistors;
   first transistor gate lines connected to the first pair of cell transistors, respectively;
   a dummy transistor next to the first pair of cell transistors; and
   a dummy gate line laid in parallel with the first transistor gate lines, wherein
      the dummy gate line is connected to the dummy transistor,
      the dummy gate line applies an off voltage to the dummy transistor, and
      an interval between the first transistor gate lines is equal to an interval between the dummy gate line and one of the first transistor gate lines neighboring the dummy gate line.

13. The nonvolatile semiconductor storage device according to claim 12 further comprising:
   a second pair of cell transistors next to the dummy transistor on an opposite side of the first pair of cell transistors; and
   second transistor gate lines connected to the second pair of cell transistors, respectively, wherein
      an interval between the second transistor gate lines is equal to an interval between the dummy gate line and one of the second transistor gate lines neighboring the dummy gate line.

14. The nonvolatile semiconductor storage device according to claim 12, wherein the first pair of cell transistors forms a pair of mask read only memory cells.

15. A nonvolatile semiconductor storage device comprising:
   a first cell transistor;
   a second cell transistor;
   transistor gate lines connected to the first cell transistor and the second cell transistor, respectively;
   a dummy transistor arranged between the first cell transistor and the second cell transistor; and
   a dummy gate line laid in parallel with the transistor gate lines, wherein
      the dummy gate line applies an off voltage to the dummy transistor,
      the first cell transistor includes an impurity diffusion layer,
      the dummy transistor includes an impurity diffusion layer continuously formed with the impurity diffusion layer of the first cell transistor, and
      the second cell transistor includes an impurity diffusion layer, and
      the dummy transistor further includes an impurity diffusion layer continuously formed with the impurity diffusion layer of the second cell transistor.

16. The nonvolatile semiconductor storage device according to claim 15, wherein
   the dummy transistor further includes one linear active region ranging on both sides of the dummy gate line without a break.

17. The nonvolatile semiconductor storage device according to claim 15, wherein
   the first cell transistor forms a first mask read only memory cell, and
   the second cell transistor forms a second mask read only memory cell.

* * * * *